US011825738B2

(12) United States Patent
Li et al.

(10) Patent No.: US 11,825,738 B2
(45) Date of Patent: Nov. 21, 2023

(54) ORGANIC LIGHT-EMITTING DIODE DEVICE AND DISPLAY PANEL

(71) Applicant: Wuhan China Star Optoelectronics Semiconductor Display Technology Co., Ltd., Hubei (CN)

(72) Inventors: Weiwei Li, Hubei (CN); Shengfang Liu, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 507 days.

(21) Appl. No.: 17/261,603

(22) PCT Filed: Aug. 26, 2020

(86) PCT No.: PCT/CN2020/111220
§ 371 (c)(1),
(2) Date: Jan. 20, 2021

(87) PCT Pub. No.: WO2022/007141
PCT Pub. Date: Jan. 13, 2022

(65) Prior Publication Data
US 2022/0190254 A1   Jun. 16, 2022

(30) Foreign Application Priority Data
Jul. 6, 2020   (CN) .......................... 202010639320.7

(51) Int. Cl.
*H01L 51/50* (2006.01)
*H10K 85/60* (2023.01)
(Continued)

(52) U.S. Cl.
CPC ........... *H10K 85/626* (2023.02); *H10K 50/11* (2023.02); *H10K 50/12* (2023.02); *H10K 50/13* (2023.02);
(Continued)

(58) Field of Classification Search
CPC ...... H10K 85/626; H10K 50/11; H10K 50/12; H10K 50/13; H10K 71/00; H10K 2101/10;
(Continued)

(56) References Cited

U.S. PATENT DOCUMENTS 10,468,621 B2 * 11/2019 Liao .................... H10K 50/171
2009/0230844 A1    9/2009 Pfeiffer et al.
(Continued)

FOREIGN PATENT DOCUMENTS

CN        101771071        7/2010
CN        103199197        7/2013
(Continued)

*Primary Examiner* — David Vu

(57) ABSTRACT

An organic light-emitting diode device and a display panel are provided. The display panel includes the organic light-emitting diode device. The organic light-emitting diode device includes a light-emitting material layer. The light-emitting material layer includes a red light-emitting unit, a green light-emitting unit, and a blue light-emitting unit; wherein the blue light-emitting unit includes a blue light-emitting layer and a charge connecting layer arranged in a stack.

10 Claims, 2 Drawing Sheets

(51) Int. Cl.
*H10K 50/11* (2023.01)
*H10K 50/12* (2023.01)
*H10K 50/13* (2023.01)
*H10K 71/00* (2023.01)
*H10K 101/10* (2023.01)

(52) U.S. Cl.
CPC ......... *H10K 71/00* (2023.02); *H10K 2101/10* (2023.02)

(58) Field of Classification Search
CPC .... H10K 50/131; H10K 85/615; H10K 59/35; H10K 59/12; H10K 50/125
See application file for complete search history.

(56) References Cited

U.S. PATENT DOCUMENTS

| | | |
|---|---|---|
| 2010/0163854 A1 | 7/2010 | Kho et al. |
| 2015/0014661 A1 | 1/2015 | Joo et al. |
| 2016/0190501 A1 | 6/2016 | Kim et al. |
| 2017/0256734 A1 | 9/2017 | Kim et al. |
| 2018/0375058 A1 | 12/2018 | Kawamura et al. |

FOREIGN PATENT DOCUMENTS

| | | |
|---|---|---|
| CN | 104681734 | 6/2015 |
| CN | 105742513 | 7/2016 |
| CN | 106058066 | 10/2016 |
| CN | 106601919 | 4/2017 |
| CN | 108269937 | 7/2018 |
| CN | 111370585 | 7/2020 |
| EP | 1705727 | 9/2006 |

\* cited by examiner

ORGANIC LIGHT-EMITTING DIODE DEVICE AND DISPLAY PANEL

RELATED APPLICATIONS

This application is a National Phase of PCT Patent Application No. PCT/CN2020/111220 having International filing date of Aug. 26, 2020, which claims the benefit of priority of Chinese Patent Application No. 202010639320.7 filed on Jul. 6, 2020. The contents of the above applications are all incorporated by reference as if fully set forth herein in their entirety.

FIELD AND BACKGROUND OF THE INVENTION

The invention relates to the field of organic light-emitting diodes, in particular to an organic light-emitting diode device and a display panel.

At present, active-matrix organic light-emitting diode (AMOLED) display device technology has been widely used in smartphones, and it continues to develop in a direction of low power consumption, low cost, and large size. Compared with a liquid crystal display (LCD), an organic light-emitting diode (OLED) device can be used for flexible screens. With advancement made in material technology, a problem of short lifetime of light-emitting material has been greatly relieved. Therefore, in an automotive field, both original equipment manufacturers and suppliers have successively launched research and development on organic light-emitting diode (OLED) technology. The OLED technology is involved in areas from traditional instrument control to head-up display (HUD), streaming media rearview mirror, and illumination, etc.

At present, South Korea's Samsung Corporation and LG Corporation are in a leading position in global automotive LED device technology, followed by domestic BOE Corporation and Tianma Microelectronics Co., Ltd. At present, Samsung Corporation mainly produces a parallel-mounted type (SBS) automotive organic light-emitting diode device. Similar to a structure of mobile phone, this structure cannot achieve a level of current efficiency and lifetime of a stacked tandem (tandem) type structure. LG Corporation's main product is tandem type vehicle-mounted organic light-emitting diode devices. Compared with the parallel-mounted type device, efficiency of electric current can be increased by 1.5-2 times, and lifetime can be increased by 2-4 times. However, double the amount of vapor deposition chambers needs to be used in a manufacturing process of the tandem structure, which increases complexity of mass production and is not conducive to the mass production.

As shown in FIG. 1 and FIG. 2, an organic light-emitting diode device usually includes an anode and a cathode, and a light-emitting unit positioned between the anode and the cathode. According to a number of light-emitting units, the organic light-emitting diode devices can be classified into parallel-mounted type organic light-emitting diode devices or tandem type organic light-emitting diode devices.

As shown in FIG. 1, it is a parallel-mounted type organic light-emitting diode device 910, with only one light-emitting unit 93 positioned between the anode 91 and the cathode 92. The light-emitting unit 93 includes a hole transport layer 931 (HTL), a light-emitting material layer 932 (EML), and an electron transport layer 933 (ETL), wherein the light-emitting material layer (EML) includes a red light-emitting layer R, a green light-emitting layer G, and a blue light-emitting layer B.

As shown in FIG. 2, it is a stacked tandem type organic light-emitting diode device 920, and a plurality of light-emitting units 93 connected in series are disposed between the anode 91 and the cathode 92. The adjacent light-emitting units 93 are connected by a charge generation layer 94 (CGL). Each light-emitting unit 93 includes a hole transport layer 931 (HTL), a light-emitting material layer 932 (EML), and an electron transport layer 933 (ETL), wherein the light-emitting material layer (EML) includes a red light-emitting layer R, a green light-emitting layer G, and a blue light-emitting layer B. The stacked tandem type organic light-emitting diode device 920 has better luminous efficiency, and as the number of light-emitting units 93 connected in series increases, its light-emitting efficiency grows multiple times. Under a same brightness, a lifetime of the stacked tandem type organic light-emitting diode device 920 grows exponentially compared to the parallel-mounted type organic light-emitting diode device 910.

However, in a vehicle-mounted OLED device, electric current efficiency and lifetime of blue light material have always been problems hindering its application. Moreover, a manufacturing process of the stacked tandem type organic light-emitting diode device is complicated, and multiple precision photomasks are required, which will increase production cost, decrease aperture ratio, and decrease product yield when multiple chambers are prepared.

The present application provides an organic light-emitting diode device and a display panel. On one hand, it can improve the electric current efficiency and lifetime of the parallel-mounted type organic light-emitting diode devices, and solve the problem of insufficient lifetime and efficiency of blue light materials. On the other hand, it is possible to avoid using multiple precision photomasks and chambers in the manufacturing process of stacked tandem type organic light-emitting diode devices, which reduces production costs, increases aperture ratio, and improves overall yield.

SUMMARY OF THE INVENTION

An embodiment of the present application provides an organic light-emitting diode device including a light-emitting material layer. The light-emitting material layer includes a first common blue light-emitting layer, a light-emitting unit layer, and a second common blue light-emitting layer. The light-emitting unit layer is disposed on the first common blue light-emitting layer, the light-emitting unit layer includes a red light-emitting unit, a green light-emitting unit, and a blue light-emitting unit arranged in parallel. The blue light-emitting unit includes a blue light-emitting layer and charge connecting layers electrically connected to an upper surface and a lower surface of the blue light-emitting layer. The second common blue light-emitting layer is disposed on the light-emitting unit layer.

Further, a thickness of the red light-emitting unit, a thickness of the green light-emitting unit, and a thickness of the blue light-emitting unit are same.

Further, the charge connecting layer is disposed corresponding to the blue light-emitting layer, and a shape and a size of the charge connecting layer are identical to a shape and a size of the blue light-emitting layer.

Further, a number of the charge connecting layer is one, and the charge connecting layer is disposed between the first common blue light-emitting layer and the blue light-emitting layer, or the charge connecting layer is disposed between the blue light-emitting layer and the second common blue light-emitting layer.

Further, a number of the charge connecting layer is two, one charge connecting layer is disposed between the first common blue light-emitting layer and the blue light-emitting layer, the other charge connecting layer is disposed between the blue light-emitting layer and the second common blue light-emitting layer.

Further, a thickness of the charge connecting layer ranges from 3 nm to 7 nm.

Further, the red light-emitting unit, the green light-emitting unit and the blue light-emitting unit are all quantum dot light-emitting layers.

Further, the organic light-emitting diode device further includes an anode layer, a hole injection layer, a hole transport layer, an electron transport layer, and a cathode layer. The hole injection layer is disposed on the anode layer. The hole transport layer is disposed on the hole injection layer. The light-emitting material layer is disposed on the hole transport layer. The electron transport layer is disposed on the light-emitting material layer. The cathode layer is disposed on the electron transport layer.

Further, a host material of the second common blue light-emitting layer is an electron-biased type material, a structural formula of the host material of the second common blue light-emitting layer is:

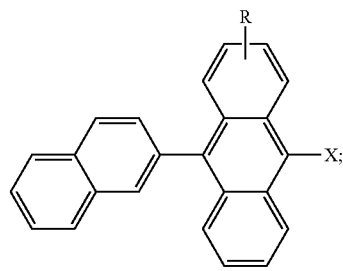

wherein R is hydrogen or a substituent including 1 to 20 carbon atoms selected from phenyl derivatives, phenyl naphthalene derivatives, naphthyl derivatives, or aryl derivatives, X is a monomer selected from naphthyl derivatives, phenyl derivatives, phenyl naphthalene derivatives, or phenyl anthracene derivatives. The main structural formula of the blue light material may also include at least one compound selected from anthracene dinaphthalene, anthracene diphenyl, anthracene diphenyl, or anthracene diphenyl.

Further, a host material of the second common blue light-emitting layer is an electron-biased type material, a structural formula of the host material is:

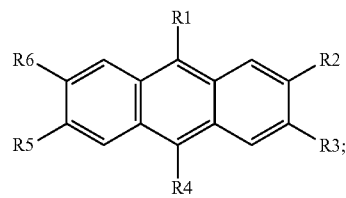

wherein R1, R2, R3, R4, R5, and R6 each is selected from a hydrogen atom, a halogen atom, a hydroxyl group, a cyano group, a nitro group, a group including carbonyl group with 20 carbon atoms or less, a group including carbonyl ester group, an alkyl group, an alkenyl group, an alkoxy group, a group including a silyl group with 30 carbon atoms or less, a group including an aryl group, a group including a heterocyclic group, a group including an amino group, or a derivative thereof.

Further, a host material of the second common blue light-emitting layer is an electron-biased type material, a structural formula of the host material is selected from any of the following structural formulas:

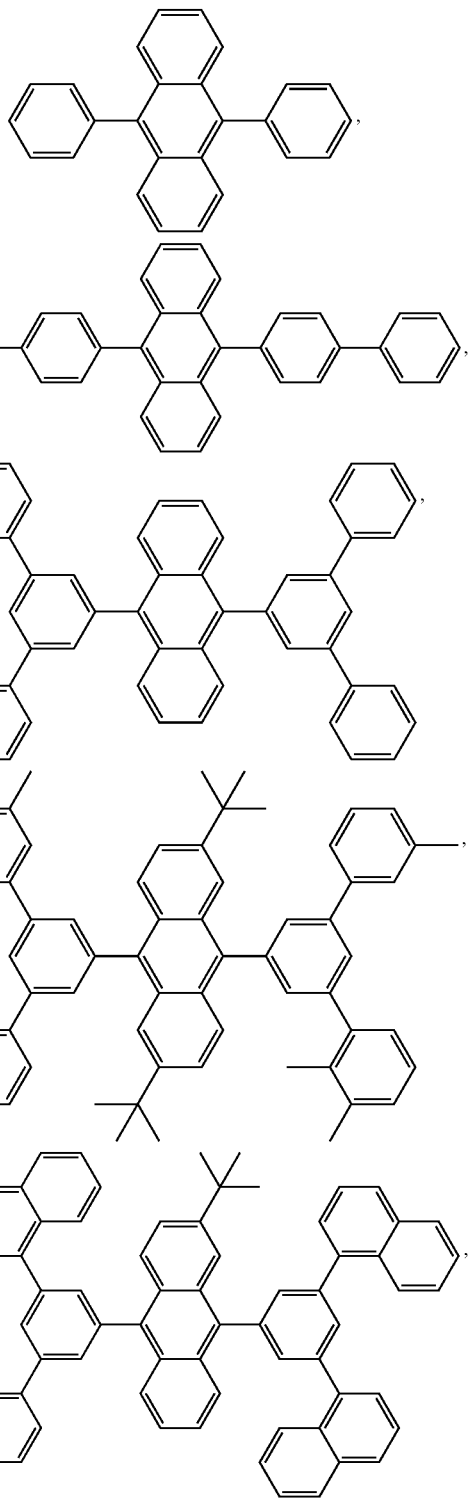

-continued

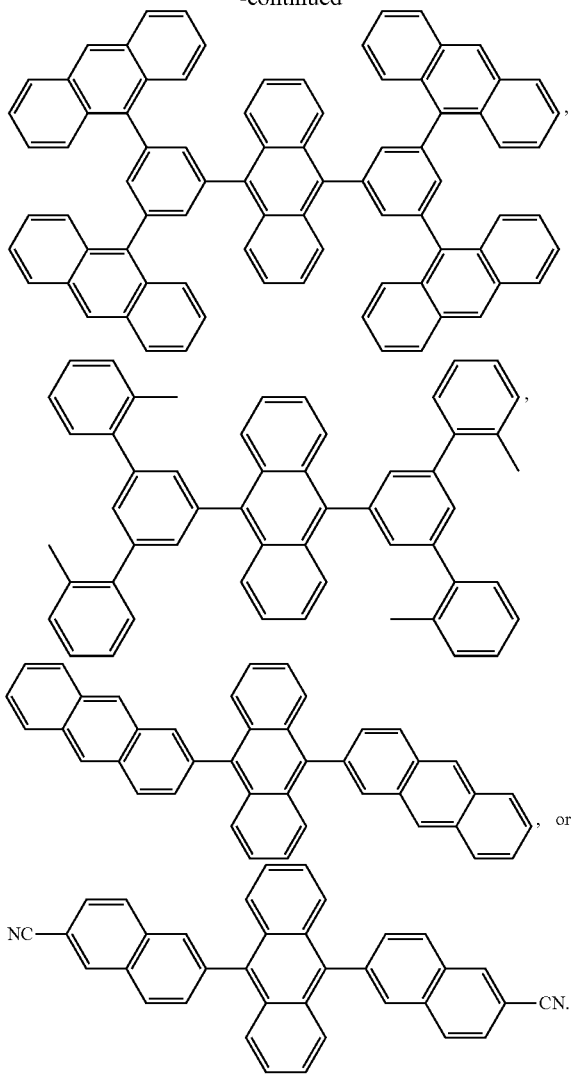

, or

Further, a host material of the first common blue light-emitting layer is a hole-biased type material. It includes N,N'-diphenyl-N, N'-(1-naphthyl)-1,1'-biphenyl-4,4'-diamine (NPB) or 4,4',4"-Tris (carbazol-9-yl) triphenylamine (TCTA). The first common blue light-emitting layer 41 further includes a blue fluorescent dopant. The blue fluorescent dopant includes any of 4,4'-bis (2,2'-distyryl)-1,1'-biphenyl (DPVBi), spiro-DPVBi, or spiro-6P.

The application also provides a display panel, including any of the above-mentioned organic light-emitting diode devices.

Beneficial Effect

The beneficial effects of the present application are described as follows: an organic light-emitting diode device and a display panel are provided. On one hand, by connecting the first common blue light-emitting layer and the second common blue light-emitting layer with the blue light-emitting unit, the electric current efficiency and lifetime of the parallel-mounted type organic light-emitting diode devices can be improved, and the problem of insufficient lifetime and efficiency of blue light materials can be solved. On the other hand, compared with stacked tandem type organic light-emitting diode devices, the number of film layers is reduced. That is, the number of chambers required is reduced, the use of multiple precision photomasks and multiple chambers are avoided, the production cost is reduced, the aperture ratio is increased, and the overall yield is improved.

DESCRIPTION OF SPECIFIC EMBODIMENTS OF THE INVENTION

The technical solutions in the embodiments of the present application will be clearly and completely described below with reference to the drawings in the embodiments of the present application. Obviously, the embodiments are only a part of the embodiments of the present application, rather than all the embodiments. Based on the embodiments in the present application, all other embodiments obtained by those skilled in the art without doing creative work are within the protection scope of this application.

In the description of the present application, it should be noted that the terms "installation", "connected to", or "connection" should be understood in a broad sense, unless otherwise clearly specified and limited. For example, it can be a fixed connection, a detachable connection, or an integral connection. It can be mechanically connected, electrically connected, or communicated with each other. It can be directly connected or indirectly connected through an intermediary. It can be a communication between two elements or an interaction relationship between two elements. For those of ordinary skill in the art, the specific meanings of the above terms in the application can be understood according to specific circumstances.

In the present application, unless expressly stipulated and defined otherwise, the first feature above or below the second feature may include direct contact between the first feature and second feature. It may also be included that the first feature and second feature are not in direct contact but in contact with another feature between them. Moreover, the first feature is above the second feature means the first feature being directly above and obliquely above the second feature, or it simply means that a horizontal height of the first feature is higher than that of the second feature. The first feature is below the second feature means the first feature directly below and obliquely below the second feature, or it simply means that a horizontal height of the first feature is lower than that of the second feature.

Figure 1:
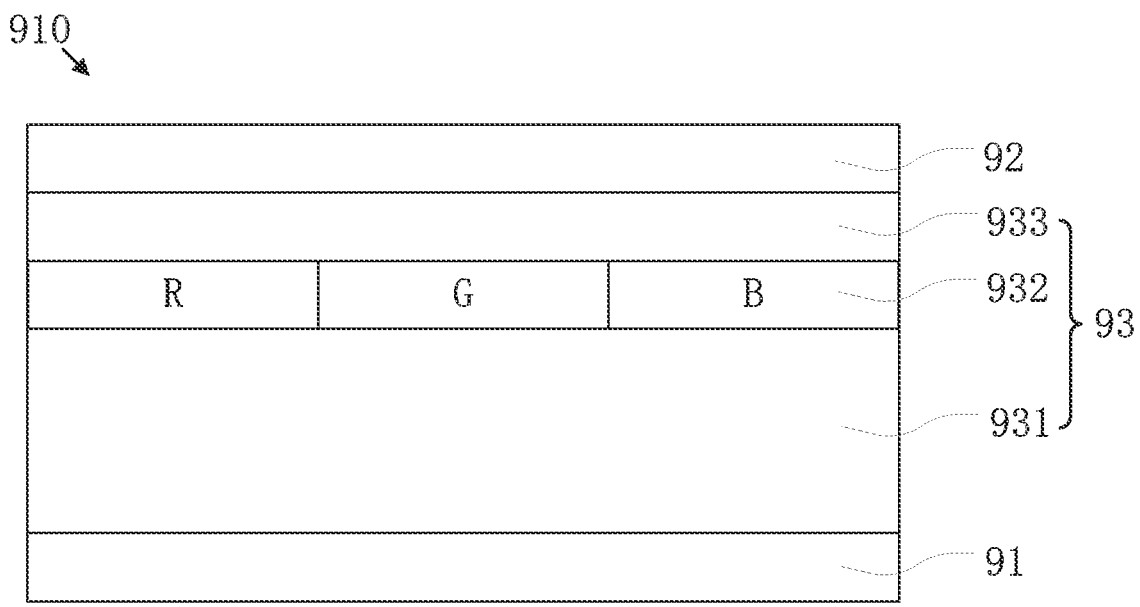
FIG. 1 is a schematic diagram of a structure of a parallel-mounted type organic light-emitting diode device.
Figure 2:
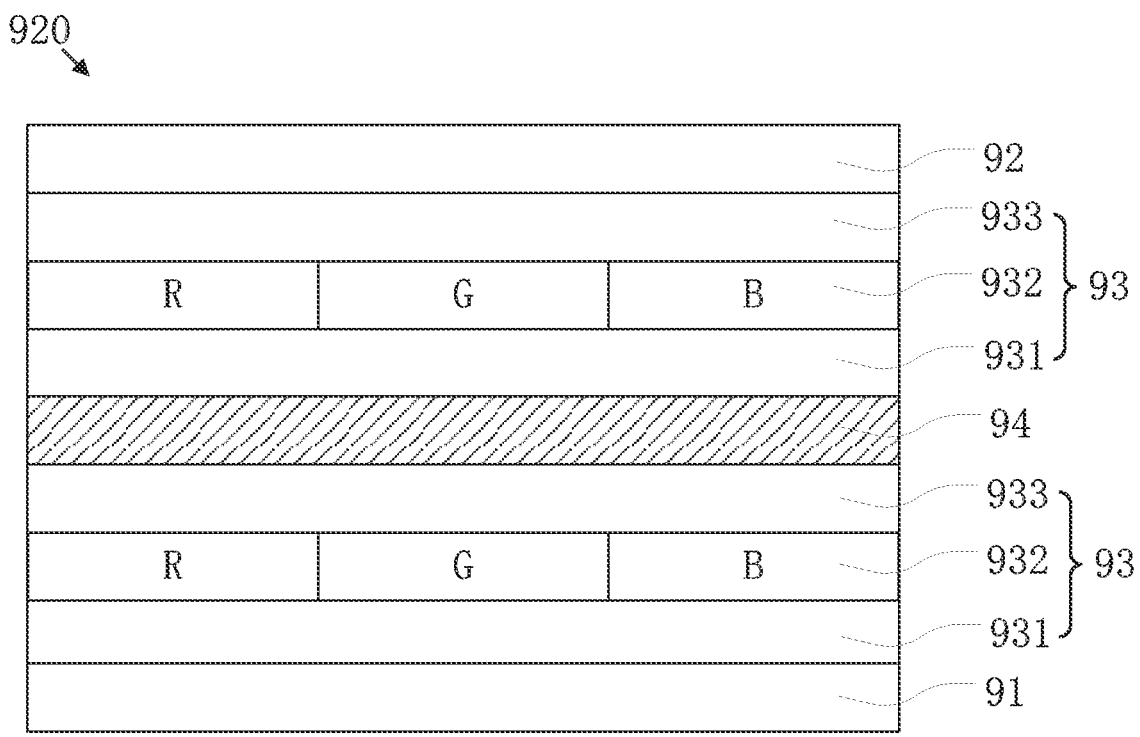
FIG. 2 is a schematic diagram of a structure of a stacked tandem type organic light-emitting diode device.
Figure 3:
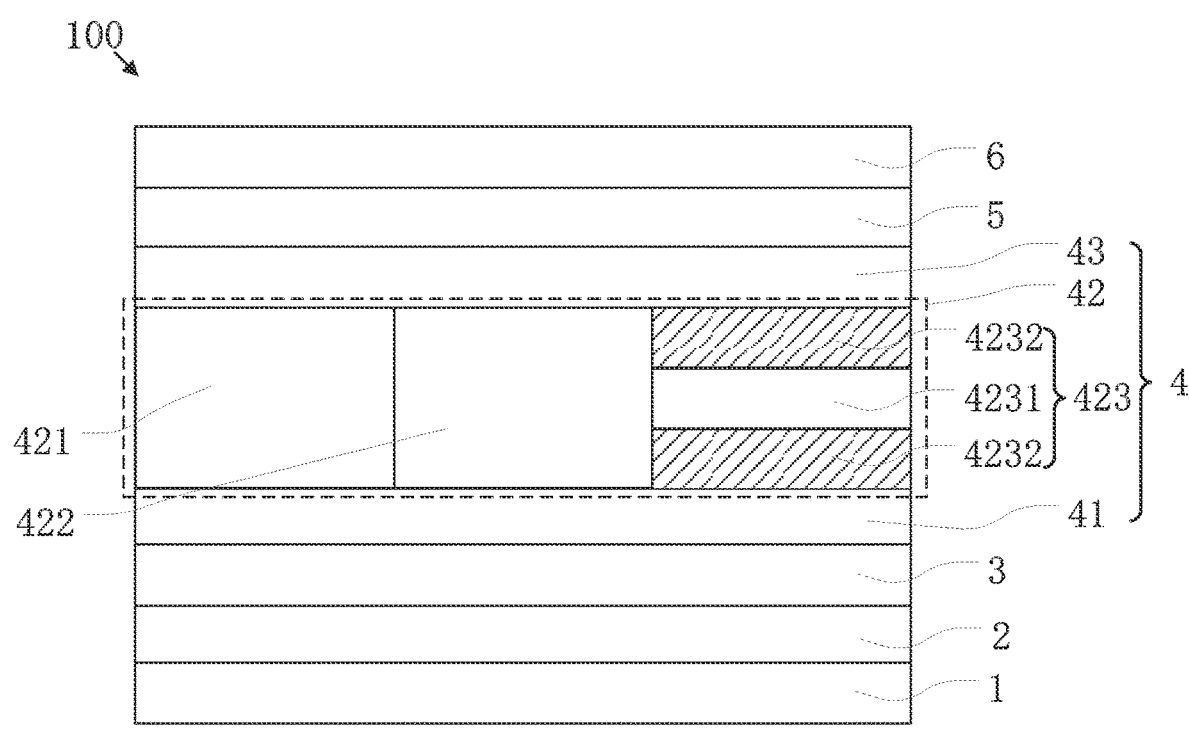
FIG. 3 is a schematic structural diagram of an organic light-emitting diode device in an embodiment of the application.

Specifically, please refer to FIG. 3, an embodiment of the present application provides an organic light-emitting diode device 100, which includes a light-emitting material layer 4, and the light-emitting material layer 4 includes a first common blue light-emitting layer 41, a light-emitting unit layer 42, and a second common blue light-emitting layer 43. The light-emitting unit layer 42 is disposed on the first common blue light-emitting layer 41, the light-emitting unit layer 41 includes a red light-emitting unit 421, a green light-emitting unit 422, and a blue light-emitting unit 423 arranged in parallel. The blue light-emitting unit 423 has a three-layer structure and includes a blue light-emitting layer and a charge connecting layer 4232 electrically connected to an upper surface and a lower surface of the blue light-emitting layer 4231. The second common blue light-emitting layer 43 is disposed on the light-emitting unit layer 42.

On one hand, the present application improves the electric current efficiency and lifetime of the parallel-mounted type organic light-emitting diode devices, and solves the problem of insufficient lifetime and efficiency of blue light materials. On the other hand, the number of multiple chambers is reduced by reducing the number of structural film layers. Compared to stacked tandem type organic light-emitting diode devices, the use of multiple precision photomasks and multiple chambers can be avoided, which reduces production costs, increases aperture ratio, and improves overall yield.

In this embodiment, the thicknesses of the red light-emitting unit 421, the green light-emitting unit 422, and the blue light-emitting unit 423 are same, so that the thickness of the light-emitting unit layer 42 is uniform.

In this embodiment, the charge connecting layer 4232 is disposed corresponding to the blue light-emitting layer 4231, and a shape and a size of the charge connecting layer 4232 are identical as those of the blue light-emitting layer 4231.

As shown in FIG. 3, in this embodiment, the number of the charge connecting layers 4232 is two. One charge connecting layer 4232 is disposed between the first common blue light-emitting layer 41 and the blue light-emitting layer 4231, the other charge connecting layer 4232 is disposed between the blue light-emitting layer 4231 and the second common blue light-emitting layer 43. That is, one charge connection layer 4232 is electrically connected to an upper surface of the blue light-emitting layer 4231, and the other charge connection layer 4232 is electrically connected to a lower surface of the blue light-emitting layer 4231.

In other embodiment, the number of the charge connecting layer 4232 can be only one, and the charge connecting layer 4232 is disposed between the first common blue light-emitting layer 41 and the blue light-emitting layer 4231, or the charge connecting layer is disposed between the blue light-emitting layer 4231 and the second common blue light-emitting layer 43. That is, the charge connecting layer 4232 is electrically connected to an upper surface of the blue light-emitting layer 4231 or is electrically connected to a lower surface of the blue light-emitting layer 4231.

In this embodiment, the thicknesses of the charge connecting layers 4232 that are electrically connected to the upper surface and the lower surface of the blue light emitting layer 4231 are same, both of which are 3 nm-7 nm, preferably 5 nm. The charge connecting layer 4232 functions as a series connection, and the thickness of the blue light-emitting layer 4231 can be controlled by adjusting the thickness of the charge connecting layer 4232. The thickness of the first common blue light-emitting layer 41 plus that of the second common blue light-emitting layer 43 is equal to the thickness of the green optical compensation layer, which is approximately 30 nm-40 nm. Therefore, a set of photomasks used for green optical compensation can be omitted.

In this embodiment, the red light-emitting unit 421, the green light-emitting unit 422, and the blue light-emitting unit 423 are all quantum dot light-emitting layers, which have a better light-emitting effect.

In this embodiment, the organic light-emitting diode device 100 further includes an anode layer 1, a hole injection layer 2, a hole transport layer 3, an electron transport layer 5, and a cathode layer 6. The hole injection layer 2 is disposed on the anode layer 1. The hole transport layer 3 is disposed on the hole injection layer 2. The light-emitting material layer 4 is disposed on the hole transport layer 3. The electron transport layer 5 is disposed on the light-emitting material layer 4. The cathode layer 6 is disposed on the electron transport layer 5.

In this embodiment, a host material of the second common blue light-emitting layer 43 is an electron-biased type material, a structural formula of the host material is:

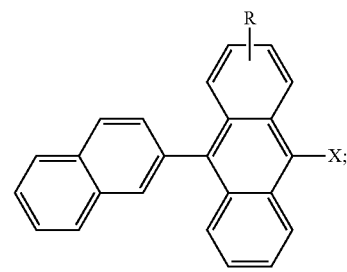

wherein R is hydrogen or a substituent including 1 to 20 carbon atoms selected from phenyl derivatives, phenyl naphthalene derivatives, naphthyl derivatives, or aryl derivatives, X is a monomer selected from naphthyl derivatives, phenyl derivatives, phenyl naphthalene derivatives, or phenyl anthracene derivatives. The main structural formula of the blue light material may also include at least one compound selected from anthracene dinaphthalene, diphenyl anthracene, anthracene naphthalene biphenyl, or anthracene diphenyl.

In this embodiment, a host material of the second common blue light-emitting layer 43 is an electron-biased type material, a structural formula of the host material is:

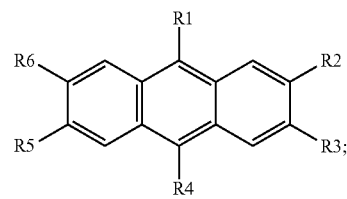

wherein R1, R2, R3, R4, R5, and R6 each is selected from a hydrogen atom, a halogen atom, a hydroxyl group, a cyano group, a nitro group, a group including carbonyl group with 20 carbon atoms or less, a group including carbonyl ester group, an alkyl group, an alkenyl group, an alkoxy group, a group including a silyl group with 30 carbon atoms or less, a group including an aryl group, a group including a heterocyclic group, a group including an amino group, or a derivative thereof.

In this embodiment, a host material of the second common blue light-emitting layer 43 is an electron-biased type material, a structural formula of the host material is selected from any of the following structural formulas:

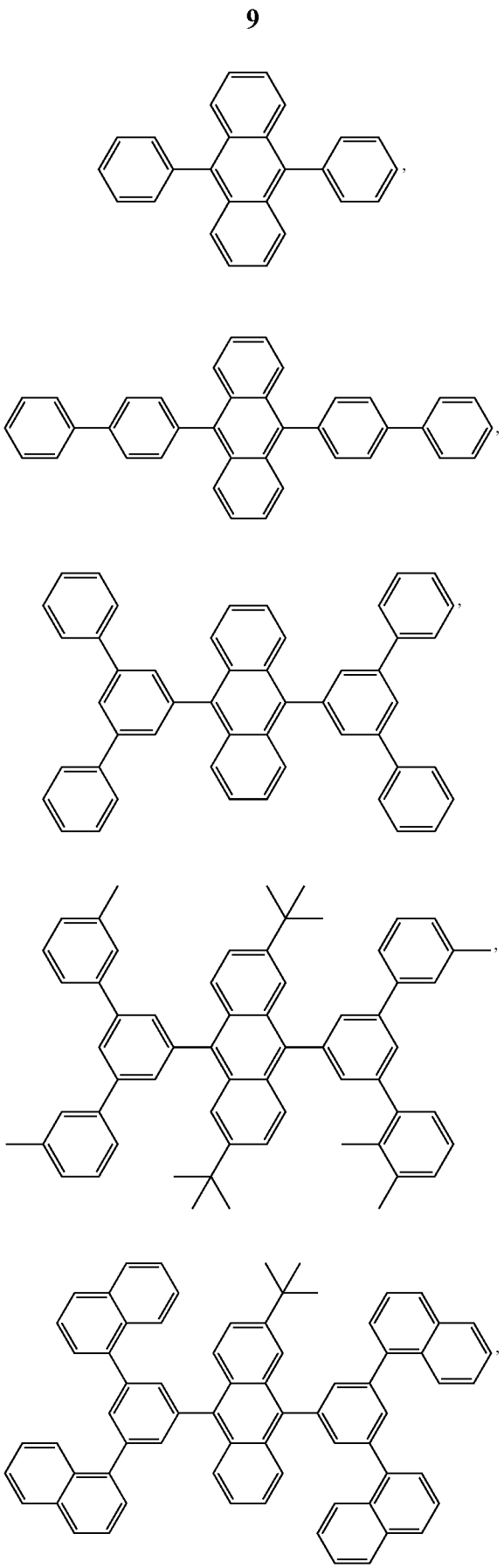

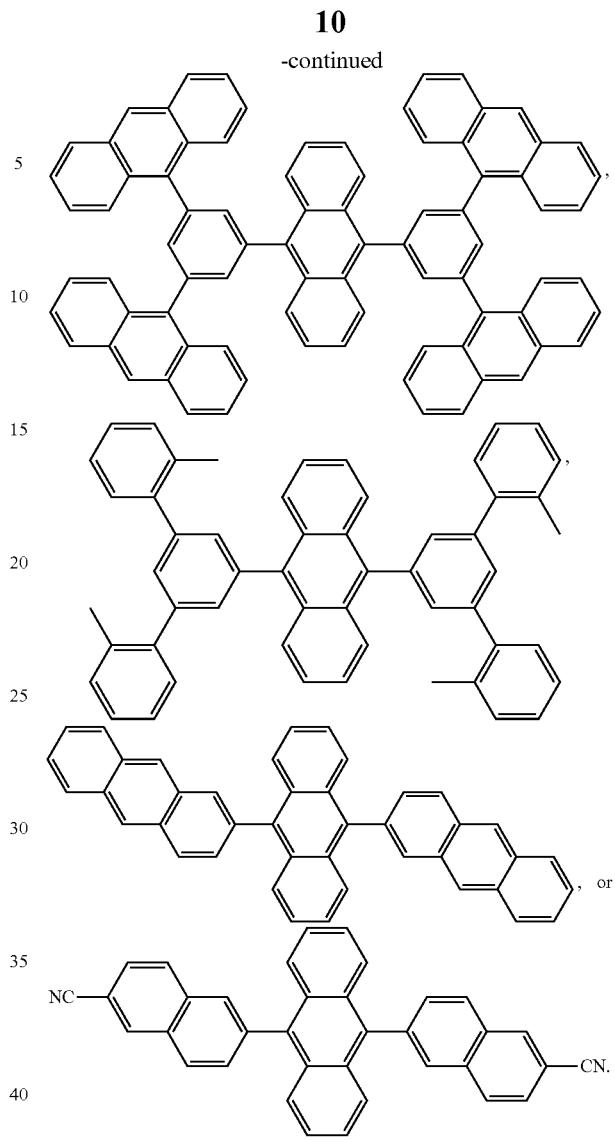

In this embodiment, a host material of the first common blue light-emitting layer 41 is a hole-biased type material. It includes N, N'-diphenyl-N, N'-(1-naphthyl)-1,1'-biphenyl-4,4'-diamine (NPB) or 4,4',4"-Tris(carbazol-9-yl) triphenylamine (TCTA). The first common blue light-emitting layer 41 further includes a blue fluorescent dopant. The blue fluorescent dopant includes any of 4,4'-bis(2,2'-distyryl)-1,1'-biphenyl (DPVBi), spiro-DPVBi, or spiro-6P.

In this embodiment, a host material of the second charge connecting layer 4232 is an electron-biased type material. In addition, an energy level of the highest occupied molecular orbital (HOMO) of the host material of the second charge connecting layer is less than an energy level of the highest occupied molecular orbital of the red light-emitting unit 421 and that of the green light-emitting unit 422, which plays a role of blocking holes for the red light-emitting unit 421 and the green light-emitting unit 422. The host material of the second charge connecting layer 4232 can also be a hole-biased type material. The energy level of the highest occupied molecular orbital (HOMO) of the red light-emitting unit 421 and that of the green light-emitting unit 422 are both less than the energy level of the highest occupied molecular orbital (HOMO) of the host material of the second charge connection layer 4232.

The present application also provides a display panel, including any of the organic light-emitting diode devices 100 described above.

In the above embodiments, the description of each embodiment has its own focus. For parts that are not detailed in a certain embodiment, reference may be made to related descriptions of other embodiments.

The organic light-emitting diode device and the display panel provided by the embodiments of the present application are described in detail above. Specific examples are used to describe the principles and implementation of the application, and the description of the above examples is only used to help understand the technical solutions and core ideas of the application. Those of ordinary skill in the art should understand that they can still possible to modify the technical solutions stated in the foregoing embodiments, or equivalently replace some of the technical features. However, these modifications or replacements do not cause the essence of the corresponding technical solutions to deviate from the scope of the technical solutions of the embodiments of the present application.

What is claimed is:

1. An organic light-emitting diode device, comprising a light-emitting material layer, the light-emitting material layer comprising:
   a first common blue light-emitting layer;
   a light-emitting unit layer disposed on the first common blue light-emitting layer, the light-emitting unit layer comprising a red light-emitting unit, a green light-emitting unit, and a blue light-emitting unit arranged in parallel; wherein the blue light-emitting unit comprises a blue light-emitting layer and a charge connecting layer arranged in a stack; and
   a second common blue light-emitting layer disposed on the light-emitting unit layer.

2. The organic light-emitting diode device according to claim 1, wherein a thickness of the red light-emitting unit, a thickness of the green light-emitting unit, and a thickness of the blue light-emitting unit are same.

3. The organic light-emitting diode device according to claim 1, wherein the charge connecting layer is disposed corresponding to the blue light-emitting layer, and a shape and a size of the charge connecting layer are identical to a shape and a size of the blue light-emitting layer.

4. The organic light-emitting diode device according to claim 3, wherein a number of the charge connecting layer is one, and the charge connecting layer is disposed between the first common blue light-emitting layer and the blue light-emitting layer, or the charge connecting layer is disposed between the blue light-emitting layer and the second common blue light-emitting layer.

5. The organic light-emitting diode device according to claim 3, wherein a number of the charge connecting layer is two, one charge connecting layer is disposed between the first common blue light-emitting layer and the blue light-emitting layer, and the other charge connecting layer is disposed between the blue light-emitting layer and the second common blue light-emitting layer.

6. The organic light-emitting diode device according to claim 1, wherein a thickness of the charge connecting layer ranges from 3 nm to 7 nm.

7. The organic light-emitting diode device according to claim 1, further comprising:
   an anode layer;
   a hole injection layer disposed on the anode layer;
   a hole transport layer disposed on the hole injection layer;
   the light-emitting material layer disposed on the hole transport layer;
   an electron transport layer disposed on the light-emitting material layer; and
   a cathode layer disposed on the electron transport layer.

8. The organic light-emitting diode device according to claim 1, wherein a host material of the second common blue light-emitting layer is an electron-biased type material, and a structural formula of the host material of the second common blue light-emitting layer is:

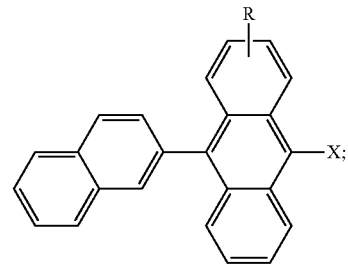

wherein R is hydrogen or a substituent comprising 1 to 20 carbon atoms selected from phenyl derivatives, phenyl naphthalene derivatives, naphthyl derivatives, or aryl derivatives, and X is a monomer selected from naphthyl derivatives, phenyl derivatives, phenyl naphthalene derivatives, or phenyl anthracene derivatives.

9. The organic light-emitting diode device according to claim 1, wherein a host material of the second common blue light-emitting layer is an electron-biased type material, and a structural formula of the host material is:

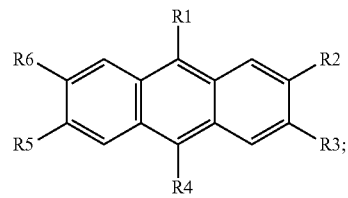

wherein R1, R2, R3, R4, R5, and R6 each is selected from a hydrogen atom, a halogen atom, a hydroxyl group, a cyano group, a nitro group, a group comprising carbonyl group with 20 carbon atoms or less, a group comprising carbonyl ester group, an alkyl group, an alkenyl group, an alkoxy group, a group comprising a silyl group with 30 carbon atoms or less, a group comprising an aryl group, a group comprising a heterocyclic group, a group comprising an amino group, or a derivative thereof.

10. A display panel, comprising the organic light-emitting diode device of claim 1.

* * * * *